(12) United States Patent
Mishra et al.

(10) Patent No.: US 11,603,512 B2
(45) Date of Patent: Mar. 14, 2023

(54) CLEANING COMPOSITIONS AND METHODS OF USE THEREOF

(71) Applicant: Fujifilm Electronic Materials U.S.A., Inc., N. Kingstown, RI (US)

(72) Inventors: Abhudaya Mishra, Gilbert, AZ (US); Carl Ballesteros, San Tan Valley, AZ (US); Eric Turner, Phoenix, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 217 days.

(21) Appl. No.: 17/204,983

(22) Filed: Mar. 18, 2021

(65) Prior Publication Data

US 2021/0292685 A1 Sep. 23, 2021

Related U.S. Application Data

(60) Provisional application No. 62/991,612, filed on Mar. 19, 2020.

(51) Int. Cl.
| | | |
|---|---|---|
| C11D 1/02 | (2006.01) | |
| C11D 7/36 | (2006.01) | |
| C11D 7/34 | (2006.01) | |
| H01L 21/02 | (2006.01) | |
| C11D 7/32 | (2006.01) | |

(Continued)

(52) U.S. Cl.
CPC ............ *C11D 7/36* (2013.01); *C11D 7/265* (2013.01); *C11D 7/3245* (2013.01); *C11D 7/34* (2013.01); *C11D 11/0047* (2013.01); *H01L 21/02057* (2013.01)

(58) Field of Classification Search
USPC ....................................................... 510/175
See application file for complete search history.

(56) References Cited

U.S. PATENT DOCUMENTS

| 5,965,513 A | 10/1999 | Allan et al. |
| 6,730,644 B1 | 5/2004 | Ishikawa et al. |
| 6,998,352 B2 | 2/2006 | Aoki et al. |

(Continued)

FOREIGN PATENT DOCUMENTS

| JP | 3803360 B2 | 5/2006 | ............... C11D 7/26 |
| TW | 202014510 A | * 4/2020 | ............... C11D 1/12 |

(Continued)

OTHER PUBLICATIONS

International Search Report and Written Opinion of the International Searching Authority for International Application No. PCT/US2021/022905, dated May 27, 2021.

(Continued)

*Primary Examiner* — Gregory E Webb
(74) *Attorney, Agent, or Firm* — Fish & Richardson P.C.

(57) ABSTRACT

The present disclosure relates to cleaning compositions that can be used to clean semiconductor substrates. These cleaning compositions can be used to remove defects arising from previous processing steps on these semiconductor substrates. These cleaning compositions can remove the defects/contaminants from the semiconductor substrates and thereby make the substrates appropriate for further processing. The cleaning compositions described herein primarily contain at least one organic acid and at least one anionic polymer.

21 Claims, 5 Drawing Sheets

(51) Int. Cl.
*C11D 11/00* (2006.01)
*C11D 7/26* (2006.01)

(56) References Cited

U.S. PATENT DOCUMENTS

| | | |
|---|---|---|
| 8,227,394 B2 | 7/2012 | Zhu et al. |
| 10,507,563 B2 | 12/2019 | Mitsumoto et al. |
| 2002/0098697 A1 | 7/2002 | Shimazu et al. |
| 2009/0286708 A1 | 11/2009 | Murakami et al. |
| 2009/0291873 A1 | 11/2009 | Tamboli |
| 2011/0136717 A1 | 6/2011 | Tamboli et al. |
| 2012/0244705 A1 | 9/2012 | Li et al. |
| 2016/0074308 A1 | 3/2016 | Franklin et al. |
| 2017/0330762 A1 | 11/2017 | Kamei et al. |
| 2018/0111248 A1 | 4/2018 | Mitsumoto et al. |
| 2018/0127683 A1 | 5/2018 | Levitt et al. |
| 2018/0204736 A1 | 7/2018 | White et al. |
| 2019/0168265 A1 | 6/2019 | White |
| 2019/0177671 A1 | 6/2019 | Parson et al. |
| 2019/0249122 A1 | 8/2019 | Uchida |
| 2019/0301028 A1 | 10/2019 | Chen |
| 2020/0017719 A1 | 1/2020 | Ishida et al. |
| 2020/0024547 A1 | 1/2020 | Ishida et al. |

FOREIGN PATENT DOCUMENTS

| | | | | |
|---|---|---|---|---|
| WO | WO 1995/007957 | 3/1995 | ............... | C10D 3/00 |
| WO | WO 2010/147485 | 12/2010 | ............... | C11D 7/26 |
| WO | WO 2018/039603 | 3/2018 | ............... | C11D 3/33 |

OTHER PUBLICATIONS

PubChem CID 643460, dated Mar. 25, 2005, Retrieved on May 10, 2021, retrieved from Internet: URL: https://pubchem.ncbi.nlm.nih.gov/compound/Sorbic-acid.

PubChem CID 612, dated Sep. 16, 2004, Retrieved on May 10, 2021, Retrieved from Internet: URL: https://pubchem.ncbi.nlm.nih.gov/compound/612d.

\* cited by examiner

CLEANING COMPOSITIONS AND METHODS OF USE THEREOF

CROSS-REFERENCE TO RELATED APPLICATION

The present application claims priority to U.S. Provisional Application Ser. No. 62/991,612, filed on Mar. 19, 2020, the contents of which are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

CMP is a process used to planarize/flatten a wafer surface by removing material using abrasion-based physical processes concurrently with surface-based chemical reactions. In general, a CMP process involves applying a CMP slurry (e.g., an aqueous chemical formulation) to a wafer surface while contacting the wafer surface with a polishing pad and moving the polishing pad in relation to the wafer. Slurries typically include an abrasive component and dissolved chemical components, which can vary significantly depending upon the materials (e.g., metals, metal oxides, metal nitrides, dielectric materials such as silicon oxide, silicon nitride, etc.) present on the wafer that will be interacting with the slurry and the polishing pad during the CMP process.

Figure 1:
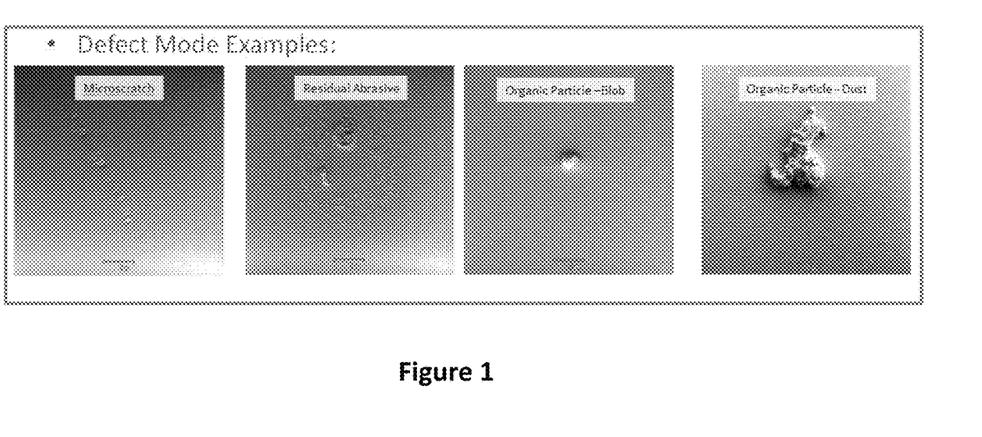
FIG. 1: Examples of various types of defectivity encountered before and after post-CMP cleaning with post-CMP cleaners. The four defectivity modes shown (scratch, residual abrasive, and organic particles (blob and dust)) primarily contribute to the overall total defect counts (TDC) seen on the wafers. The defect images were collected on an Applied Materials SEMVision G5 SEM tool.

After CMP processing, a variety of contaminants may be present on the surface of the polished wafer. Contaminants may include, for example, particulate abrasives from the CMP slurry, organic residues from the pad or slurry components, and materials removed from the wafer during the CMP process. If left on the surface of the polished wafer, these contaminants may lead to failures during further wafer processing steps and/or to diminished device performance. FIG. 1 shows four different defect mode types after CMP polish—scratches, residual abrasives, organic particles in a blob, and organic particles in dust.

Thus, the contaminants need to be effectively removed so that the wafer may predictably undergo further processing and/or to achieve optimal device performance. The process of removing these post-polishing contaminants or residues on the wafer surface after CMP is called post-CMP cleaning. The formulations used in this post-CMP cleaning process are called post-CMP (P-CMP) cleaning solutions or compositions. These P-CMP cleaning solutions/formulations are intended to solubilize defects remaining on the wafer surface after the CMP step and thereby remove these defects and make the wafer surface clean. That further ensures that once the wafer undergoes further processing, the device performance and chip yields are satisfactory.

The post-CMP cleaning process can be carried out in brush boxes (containing brushes for mechanical action) or Megasonics (advanced ultrasonic/sonication for mechanical action) that come as attachments/modules on the CMP polishing tools. To begin a P-CMP cleaning process, the brush box or the Megasonic is flooded with the P-CMP cleaning composition. Thereafter, after the CMP polishing process has been completed, the CMP polished wafers are passed through the brush box and/or Megasonic in the CMP polishing tool that contains the P-CMP cleaning composition. In a best case scenario, the wafers come out dry and cleaned with very low defectivity after being subjected to chemical action by the post-CMP cleaning composition and scrubbing mechanical action by the brush and/or the sonication.

SUMMARY

In semiconductor chip manufacturing, defectivity on the wafer surface is key to the yield of the wafers. A typical wafer goes through about 1000 processes before chips are made and the individual dies are cut from the wafer. At each of these processes, the defectivity is monitored pre- & post-process. CMP is an important step in chip manufacturing. However, the CMP step introduces lots of defects after the polishing steps (see FIG. 1 and pre-images in FIG. 2). Thus, after the CMP polishing step, a post-CMP (P-CMP) cleaning composition is typically applied to the wafer surface to reduce the defects (see FIG. 2 post-images). The present disclosure features novel P-CMP cleaning compositions which not only reduce wafer defects but also provide various other favorable electrochemical attributes that are critical for chip manufacturing. For example, these P-CMP cleaning compositions not only reduce defectivity (thereby increasing yield), but also ensure that there is no galvanic corrosion (or other forms of corrosion) when metals and metal oxides and nitrides come in contact with each other on a patterned wafer.

The present disclosure relates to cleaning compositions that can be used to clean semiconductor substrates. For example, these cleaning compositions can be used to remove defects arising from previous processing steps, such as CMP, on these semiconductor substrates. In particular, these cleaning compositions can remove the defects/contaminants from the semiconductor substrates and thereby make the substrates appropriate for further processing. The cleaning compositions described herein generally contain an organic acid and an anionic polymer, and have a pH in the 0.1 to 7 range.

In one aspect, the present disclosure features a cleaning composition that includes at least one first organic acid; at least one second organic acid different from the at least one first organic acid, the at least one second organic acid comprising a dienoic acid; at least one anionic polymer; and water, wherein the composition has a pH of from about 0.1 to about 7.

In another aspect, the present disclosure features a cleaning composition that includes at least one organic acid; at least one anionic polymer comprising poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), 2-acrylamido-2-methyl propanesulfonic acid-acrylic acid copolymer, poly(4-styrenesulfonic acid-co-acrylic acid-co-vinylphosphonic acid) terpolymer; and water; wherein the composition has a pH of from about 0.1 to about 7.

In another aspect, the present disclosure features a method for cleaning a wafer surface, the method including contacting a wafer having a surface comprising SiN, SiC, TiN, W, Ru, Mo, TEOS, Cu, TaN, Co, or p-Si with the cleaning composition described herein.

In another aspect, the present disclosure features a method for cleaning a substrate, the method including contacting a substrate with the cleaning composition described herein.

This summary is provided to introduce a selection of concepts that are further described below in the detailed description. This summary is not intended to identify key or essential features of the claimed subject matter, nor is it intended to be used as an aid in limiting the scope of the claimed subject matter.

DESCRIPTION OF DRAWINGS

FIG. 2: Total defect counts (TDC) on silicon nitride wafers collected on a KLA AIT XUV tool. Rows 1 & 2 show TDC on two wafers (i.e., wafers 1 and 2) after CMP and before treatment with P-CMP cleaning composition (also referred to as pre-images). Rows 3 & 4 show TDC on these two wafers after treatment with P-CMP cleaning composition (also referred to as post-images). The TDC numbers are shown alongside each wafer. Comparative Example (Column 1) was the industry standard Fujifilm Wako P-CMP cleaner CLEAN-100. Columns 2, 3 & 4 depict the P-CMP cleaning compositions, Cleaner A, B & C respectively, from this disclosure. As can be seen from the wafer maps, the Comparative Example provided only ~40% defectivity improvement, whereas the inventive Cleaners A-C provided defect reduction from about 90% to about 98%.

DETAILED DESCRIPTION

Embodiments disclosed herein relate generally to cleaning compositions and methods of using such compositions to clean substrates (e.g., semiconductor substrates such as wafers). In particular, the cleaning compositions can be used to clean substrates after a CMP process. However, the cleaning compositions described herein can also find use in removing residue and/or contaminants from a substrate surface after an etching process, after an aching process, or after a plating process.

As defined herein, residue and/or contaminants can include components present in a CMP polishing composition that has been used to polish the substrate to be cleaned (e.g., abrasives, molecular components, polymers, acids, bases, salts, surfactants, etc.), compounds produced during the CMP process as a result of chemical reactions between the substrate and the polishing composition and/or between components of the polishing composition, polishing pad polymeric particles, polishing byproducts, organic or inorganic residues (from CMP slurry or CMP pad), substrate (or wafer) particles liberated during the CMP process, and/or any other removable materials that are known to deposit on a substrate after a CMP process.

In one or more embodiments, a cleaning composition described herein includes (1) at least one first organic acid, (2) at least one second organic acid different from the at least one first organic acid, the at least one second organic acid containing a dienoic acid, and (3) at least one anionic polymer. In one or more embodiments, a cleaning composition of the present disclosure can include from about 0.00001% to about 50% (e.g., from about 0.01% to about 5%) by weight of the at least one first organic acid, from about 0.0001% to about 0.5% (e.g., from about 0.01% to about 0.1%) by weight of the at least one second organic acid, from about 0.00001% to about 50% (e.g., from about 0.005% to about 10%) by weight of the at least one anionic polymer, and the remaining percent by weight (e.g., from about 60% to about 99.99% by weight) of solvent (e.g., deionized water).

In one or more embodiments, the present disclosure provides for a concentrated P-CMP cleaning composition that can be diluted with water to obtain a point-of-use (POU) cleaning composition by up to a factor of 20, or up to a factor of 50, or up to a factor of 100, or up to a factor of 200, or up to a factor of 400, or up to a factor of 800, or up to a factor of 1000. In a preferred embodiment, the POU cleaning composition is diluted by a factor of 200. In other embodiments, the present disclosure provides a point-of-use (POU) cleaning composition that can be used directly for cleaning substrate surfaces.

In one or more embodiments, a POU cleaning composition can include from about 0.00001% to about 5% by weight of at least one first organic acid (e.g., a polycarboxylic acid), from about 0.0001% to about 0.1% by weight of at least one second organic acid (e.g., a dienoic acid), and from about 0.00001% to about 5% by weight of at least one anionic polymer. In another embodiment, a POU cleaning composition can include from about 0.00001% to about 5% by weight of at least one first organic acid (e.g., a polycarboxylic acid), from about 0.0001% to about 0.1% by weight of at least one second organic acid (e.g., a dienoic acid), from about 0.00001% to about 5% by weight of at least one third organic acid (e.g., an amino acid) different from the first and second organic acids, and from about 0.00001% to about 5% by weight of at least one anionic polymer.

In one or more embodiments, a concentrated P-CMP cleaning composition can include from about 0.01% to about 30% by weight of at least one first organic acid (e.g., a polycarboxylic acid), from about 0.01% to about 0.5% by weight of at least one second organic acid (e.g., a dienoic acid), and from about 0.005% to about 15% by weight of at least one anionic polymer. In another embodiment, a concentrated P-CMP cleaning composition can include from about 0.01% to about 30% by weight of at least one first organic acid (e.g., a polycarboxylic acid), from about 0.01% to about 0.5% by weight of at least one second organic acid (e.g., a dienoic acid), from about 0.01% to about 5% by weight of at least one third organic acid (e.g., an amino acid) different from the first and second organic acids, and from about 0.005% to about 15% by weight of at least one anionic polymer.

In one or more embodiments, the cleaning composition described herein can include at least one (e.g., two, three, or four) organic acid. As used herein, the term "acid" includes an acid or a salt thereof (e.g., a potassium or sodium salt thereof). In some embodiments, the at least one organic acid can be selected from the group consisting of carboxylic acids (e.g., monocarboxylic acids, polycarboxylic acids, and dienoic acids), amino acids, sulfonic acids, phosphoric acid, acrylic acids, and phosphonic acids, or salts thereof. In some embodiments, the at least one organic acid can be an acid or a salt thereof selected from the group consisting of formic acid, gluconic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, amino acetic acid, peracetic acid, potassium acetate, phenoxyacetic acid, glycine, bicine, diglycolic acid, glyceric acid, tricine, alanine, histidine, valine, phenylalanine, proline, glutamine, aspartic acid, ascorbic acid, glutamic acid, arginine, lysine, tyrosine, benzoic acid, 2,4-pentadienoic acid, 5-phenylpenta-2,4-dienoic acid, 2-hydroxypenta-2,4-dienoic acid, 2,4-hexadienoic acid (sorbic acid), 4,5-hexadienoic acid, 4,6-heptadienoic acid, 2,6-dimethylhepta-2,5-dienoic acid, (3E,5E)-hepta-3,5-dienoic acid, (2E,5Z)-Hepta-2,5-dienoic acid, octa-3,5-dienoic acid, (Z)-3,7-dimethyl-2,6-octadienoic acid, 5,7-nonadienoic acid, (E,Z)-2,4-decadienoic acid, 2,5-decadienoic acid, undecadienoic acid, dodecadienoic acid, tridecadienoic acid, tetradecadienoic acid, pentadecadienoic acid, hexadecadienoic acid, heptadecadienoic acid, (9Z,12E)-octadeca-9,12-dienoic acid, octadeca-10,12-dienoic acid, (10E,15Z)-9,12,13-trihydroxyoctadeca-10,15-dienoic acid, 13(S)-hydroxyoctadeca-9Z,11E-dienoic acid, nonadecadienoic acid, henicosadienoic acid, docosadienoic acid, eicosa-11,14-dienoic acid, or mixtures thereof salts thereof, and mixtures thereof.

In one or more embodiments, the at least one organic acid is included in the composition in an amount from about 0.00001% to about 50% by weight of the cleaning composition. For example, the at least one organic acid can be at least about 0.00001% (e.g., at least about 0.00005%, at least about 0.0001%, at least about 0.0005%, at least about 0.001%, at least about 0.005%, at least about 0.01%, at least about 0.05%, at least about 0.1%, at least about 0.5% or at least about 1%) to at most about 50% (e.g., at most about 45%, at most about 40%, at most about 35%, at most about 30%, at most about 25%, at most about 20%, at most about 15%, at most about 10%, at most about 5%, or at most about 1%) by weight of the cleaning composition described herein.

In one or more embodiments, the cleaning composition described herein can include at least one first organic acid. In some embodiments, the at least one first organic acid can be selected from the group consisting of carboxylic acids (e.g., monocarboxylic acids and polycarboxylic acids (such as bicarboxylic acids and tricarboxylic acids)), sulfonic acids, phosphoric acid, acrylic acids, peracids, and phosphonic acids. In some embodiments, the at least one first organic acid can be an acid selected from the group consisting of formic acid, gluconic acid, acetic acid, malonic acid, citric acid, propionic acid, malic acid, adipic acid, succinic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, peracetic acid, phenoxyacetic acid, benzoic acid, and mixtures thereof. In some embodiments, the at least one first organic acid can be a tricarboxylic acid (e.g., citric acid). In some embodiments, the at least one first organic acid does not include an amino acid or a dienoic acid.

In one or more embodiments, the at least one first organic acid can be at least about 0.00001% (e.g., at least about 0.00005%, at least about 0.0001%, at least about 0.0005%, at least about 0.001%, at least about 0.005%, at least about 0.01%, at least about 0.05%, at least about 0.1%, at least about 0.5%, or at least about 1%) to at most about 50% (e.g., at most about 45%, at most about 40%, at most about 35%, at most about 30%, at most about 25%, at most about 20%, at most about 15%, at most about 10%, at most about 8%, at most about 6%, at most about 5%, at most about 4%, at most about 2%, or at most about 1%) by weight of the cleaning composition described herein.

In one or more embodiments, the cleaning composition described herein can include at least one second organic acid different from the at least one first organic acid. In some embodiments, the at least one second organic acid can be dienoic acid (i.e., an acid containing a diene). In some embodiments, the dienoic acid can have from 5 to 22 carbons (e.g., 5, 6, 7, 8, 9, 10, 11, 12, 13, 14, 15, 16, 17, 18, 19, 20, 21, or 22) carbons. In some embodiments, the dienoic acid can have from 5 to 12 (e.g., 5, 6, 7, 8, 9, 10, 11, or 12) carbons. In some embodiments, the dienoic acid can be a carboxylic acid containing a diene, such as 2,4-pentadienoic acid, 5-phenylpenta-2,4-dienoic acid, 2-hydroxypenta-2,4-dienoic acid, 2,4-hexadienoic acid (sorbic acid), 4,5-hexadienoic acid, 4,6-heptadienoic acid, 2,6-dimethylhepta-2,5-dienoic acid, (3E,5E)-hepta-3,5-dienoic acid, (2E,5Z)-hepta-2,5-dienoic acid, octa-3,5-dienoic acid, (Z)-3,7-dimethyl-2,6-octadienoic acid, 5,7-nonadienoic acid, (E,Z)-2,4-decadienoic acid, 2,5-decadienoic acid, undecadienoic acid, dodecadienoic acid, tridecadienoic acid, tetradecadienoic acid, pentadecadienoic acid, hexadecadienoic acid, heptadecadienoic acid, (9Z,12E)-octadeca-9,12-dienoic acid, octadeca-10,12-dienoic acid, (10E,15Z)-9,12,13-trihydroxyoctadeca-10,15-dienoic acid, 13(S)-hydroxyoctadeca-9Z,11E-dienoic acid, nonadecadienoic acid, henicosadienoic acid, docosadienoic acid, eicosa-11,14-dienoic acid, or mixtures thereof.

In one or more embodiments, the at least one second organic acid can be at least about 0.0001% (e.g., at least about 0.0005%, at least about 0.001%, at least about 0.005%, at least about 0.01%, at least about 0.02%, at least about 0.04%, or at least about 0.05%) to at most about 0.5% (e.g., at most about 0.4%, at most about 0.3%, at most about 0.2%, at most about 0.1%, at most about 0.08%, at most about 0.06%, at most about 0.05%, at most about 0.04%, at most about 0.03%, at most about 0.02%, at most about 0.01%, or at most about 0.005%) by weight of the cleaning composition described herein.

Without wishing to be bound by theory, it is believed that including the second organic acid (e.g., a dienoic acid) in the above amount range can improve corrosion inhibition of certain metal and metal containing films (e.g., W, Cu, TaN or TiN) on the substrate during a post-CMP cleaning process. As shown in the Examples below, electrochemical studies on some embodiments containing a dienoic acid (e.g., sorbic acid) showed better metal (e.g., W) corrosion protection than P-CMP compositions without a dienoic acid.

In one or more embodiments, the cleaning composition described herein can include at least one third organic acid different from the at least one first and second organic acids. In some embodiments, the at least one third organic acid can be an amino acid (e.g., a naturally occurring amino acid or a non-naturally occurring amino acid). In some embodiments, the at least one third organic acid can be selected from the group consisting of amino carboxylic acid (e.g., amino acetic acid), glycine, bicine, tricine, alanine, histidine, valine, phenylalanine, proline, glutamine, aspartic acid, glutamic acid, arginine, lysine, tyrosine, and mixtures thereof.

In one or more embodiments, the at least one third organic acid can be at least about 0.001% (e.g., at least about 0.005%, at least about 0.01%, at least about 0.05%, at least about 0.1%, at least about 0.5%, or at least about 1%) to at most about 20% (e.g., at most about 18%, at most about 16%, at most about 15%, at most about 14%, at most about 12%, at most about 10%, at most about 8%, at most about 6%, at most about 5%, at most about 4%, at most about 2%, at most about 1%, or at most about 0.5%) by weight of the cleaning composition described herein.

In one or more embodiments, the cleaning composition described herein includes two organic acids, such as (1) citric acid and histidine or (2) citric acid and glycine. In some embodiments, the cleaning composition includes three organic acids, such as (1) citric acid, histidine, and sorbic acid or (2) citric acid, histidine, and glycine. In some embodiments, the cleaning composition includes four organic acids (e.g., citric acid, histidine, sorbic acid and glycine).

In one or more embodiments, the cleaning composition can include at least two or three organic acids (e.g., a carboxylic acid, an amino acid, and/or a dienoic acid). In some embodiments, the first organic acid (e.g., a carboxylic acid) is in an amount of from about 0.0005% to about 10% by weight of the cleaning composition described herein. In some embodiments, the second organic acid (e.g., a dienoic acid) is in an amount of from about 0.0005% to about 0.5% by weight of the cleaning composition described herein. In yet some other embodiments, the third organic acid (e.g., an amino acid) is in an amount of from about 0.005 to about 5% by weight of the cleaning composition described herein.

In one or more embodiments, the cleaning composition described herein can include at least one (e.g., two or three) anionic polymer. In one or more embodiments, the at least one anionic polymer can include one or more anionic groups, such as carboxylate, sulfate, and phosphate groups. In one or more embodiments, the at least one anionic polymer is formed from one or more monomers selected from the group consisting of (meth)acrylic acid, maleic acid, acrylic acid, vinyl phosphonic acid, vinyl phosphoric acid, vinyl sulfonic acid, allyl sulfonic acid, styrene sulfonic acid, acrylamide, acrylamidopropyl sulfonic acid, and sodium phosphinite. In more specific embodiments, the at least one anionic polymer can be selected from the group consisting of poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), polyethylenimine (PEI), anionic poly(methyl methacrylate) (PMMA), anionic polyacrylamide (PAM), polyaspartic acid (PASA), anionic poly(ethylene succinate) (PES), anionic polybutylene succinate (PBS), poly(vinyl alcohol) (PVA), 2-propenoic acid copolymer with 2-methyl-2-((1-oxo-2-propenyl)amino)-1-propanesulfonic acid monosodium salt and sodium phosphinite, 2-propenoic acid copolymer with 2-methyl-2-((1-oxo-2-propenyl) amino)-1-propanesulfonic acid monosodium salt and sodium hydrogen sulfite sodium salt, and 2-acrylamido-2-methyl-1-propanesulfonic acid-acrylic acid copolymer, poly(4-styrenesulfonic acid-co-acrylic acid-co-vinylphosphonic acid) terpolymer, and mixtures thereof. Without wishing to be bound by theory, it is believed that the anionic polymer can solubilize hydrophobic polishing materials and/or defects on a wafer surface and facilitate their removing during a post-CMP cleaning process.

In one or more embodiments, the at least one anionic polymer can have a weight average molecular weight ranging from at least about 250 g/mol (e.g., at least about 500 g/mol, at least about 1000 g/mol, at least about 2,000 g/mol, at least about 5,000 g/mol, at least about 50,000 g/mol, at least about 100,000 g/mol, at least about 200,000 g/mol, or at least about 250,000 g/mol) to at most about 500,000 g/mol (e.g., at most about 400,000 g/mol, at most about 300,000 g/mol, at most about 200,000 g/mol, at most about 100,000 g/mol, or at most about 50,000 g/mol, or at most about 10,000 g/mol). In some embodiments, the at least one anionic polymer can have a weight average molecular weight ranging from at least about 1000 g/mol to at most about 10,000 g/mol. In some embodiments, the at least one anionic polymer can have a weight average molecular weight ranging from at least about 2000 g/mol to at most about 6,000 g/mol. In yet some embodiments, the at least one anionic polymer can have a weight average molecular weight of about 5,000 g/mol.

In some embodiments, the cleaning composition described herein includes one anionic polymer such as poly(vinylphosphonic acid), 2-acrylamido-2-methyl-1-propanesulfonic acid-acrylic acid copolymer, or poly(4-styrenesulfonic acid-co-acrylic acid-co-vinylphosphonic acid) terpolymer. In some embodiments, the cleaning composition described herein includes two anionic polymers, such as (1) poly(4-styrenylsulfonic) acid and poly(acrylic) acid or (2) 2-acrylamido-2-methyl-1-propanesulfonic acid-acrylic acid copolymer and poly(acrylic) acid.

In one or more embodiments, the at least one anionic polymer is included in the composition in an amount from about 0.00001% to about 50% by weight of the cleaning composition. For example, the at least one anionic polymer can be at least about 0.00001% (e.g., at least about 0.00005%, at least about 0.0001%, at least about 0.0005%, at least about 0.001%, at least about 0.005%, at least about 0.01%, at least about 0.05%, at least about 0.1%, at least about 0.5%, or at least about 1%) to at most about 50% (e.g., at most about 45%, at most about 40%, at most about 35%, at most about 30%, at most about 25%, at most about 20%, at most about 15%, at most about 10%, at most about 5%, or at most about 1%) by weight of the cleaning composition described herein.

In some embodiments, the cleaning composition can include at least two or three anionic polymers. In some embodiments, the first anionic polymer is in an amount of from about 0.0005% to about 50% by weight of the cleaning composition described herein. In some embodiments, the second anionic polymer is in an amount of from about 0.0005% to about 30% by weight of the cleaning composition described herein. In yet some other embodiments, the third anionic polymer is in an amount of from about 0.0005% to about 10% by weight of the cleaning composition described herein.

In some embodiments, the pH value of the cleaning composition can range from at most about 7 (e.g., at most about 6.5, at most about 6, at most about 5.5, at most about 5, at most about 4.5, at most about 4, at most about 3.5, at most about 3, at most about 2.5, or at most about 2) to at least about 0.1 (e.g., at least about 0.2, at least about 0.5, at least about 1, at least about 2, at least about 2.5, at least about 3, or at least about 3.5). Without wishing to be bound by theory, it is believed that, when the cleaning composition described herein has an acidic pH within the above range, it can provide enough protons to solubilize the organic residues generated from CMP polishing of the substrates and can provide enough cleaning action to solubilize the inert metal (e.g., W, Cu) containing polishing byproducts.

Without wishing to be bound by theory, it is believed that the cleaning composition described herein can include a much smaller concentration/amount of a single chemical material or overall chemical materials than a conventional cleaner currently used in the semiconductor industry (e.g., CLEAN-100), and still achieve better performance (e.g., better cleaning efficacy and/or lower corrosion of exposed materials on a substrate). For example, the cleaning composition described herein can include a chemical material or a total amount of chemical materials that is only about 5-20% (e.g., about 5-15%) by weight of the same chemical material (e.g., an organic acid or an anionic polymer) or a total amount of chemical materials in a conventional cleaner (e.g., CLEAN-100). As a result, it is believed that the cleaning composition described herein is more cost effective and environmental friendly and offers a much better overall cost of ownership at point of use (as it is highly dilute-able (e.g., up to 200×)) when compared to a conventional cleaner (e.g., CLEAN-100).

In one or more embodiments, the cleaning composition described herein can be substantially free of one or more of certain ingredients, such as organic solvents, pH adjusting agents, quaternary ammonium compounds (e.g., salts or hydroxides), alkali bases (such as alkali hydroxides), fluoride containing compounds, silanes (e.g., alkoxysilanes), nitrogen containing compounds (e.g., amino acids, amines, or imines such as amidines such as 1,8-diazabicyclo[5.4.0]-7-undecene (DBU) and 1,5-diazabicyclo[4.3.0]non-5-ene (DBN)), polyols, salts (e.g., halide salts or metal salts), polymers (e.g., cationic, non-ionic, or water soluble polymers), inorganic acids (e.g., hydrochloric acid, sulfuric acid, phosphoric acid, or nitric acid), surfactants (e.g., cationic surfactants, anionic surfactants, non-polymeric surfactants, or non-ionic surfactants), plasticizers, oxidizing agents (e.g., $H_2O_2$), corrosion inhibitors (e.g., azole or non-azole corrosion inhibitors), electrolytes (e.g., polyelectrolytes), and/or abrasives (e.g., silica/ceria abrasives, non-ionic abrasives, surface modified abrasives, or negatively/positively charged abrasive). The halide salts that can be excluded from the cleaning compositions include alkali metal halides (e.g., sodium halides or potassium halides) or ammonium halides (e.g., ammonium chloride), and can be chlorides, bromides, or iodides. As used herein, an ingredient that is "substantially free" from a cleaning composition refers to an ingredient that is not intentionally added into the cleaning composition. In some embodiments, the cleaning composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the cleaning composition. In some embodiments, the cleaning composition described herein can be completely free of one or more of the above ingredients.

In one or more embodiments, the cleaning composition described herein can include a biocide. Exemplary biocides include, but are not limited to, isothiazolinones (such as benzisothiazolinone, methylisothiazolinone, and methylchloroisothiazolinone), 2-bromo-2-nitropropane-1,3-diol, hydrogen peroxide, and combinations thereof. In some embodiments, the biocide can be in an amount of from at most about 1000 ppm (e.g., at most about 500 ppm, at most about 250 ppm, at most about 100 ppm, at most about 50 ppm, or at most about 10 ppm) to at least about 1 ppm of the cleaning composition described herein.

As applied to post-CMP cleaning operations, the cleaning compositions described herein can be usefully employed to remove contaminants present on a substrate surface after a CMP processing step. In one or more embodiments, the contaminants causing defectivity can be at least one selected from the group consisting of abrasives, particles, organic residues, polishing byproducts, slurry byproducts, slurry induced organic residues, inorganic polished substrate residues, pad debris, and polyurethane residue, etc. In one or more embodiments, the cleaning compositions of the present disclosure can be employed to remove organic residues constituted by organic particles which are insoluble in water and thus remain on the wafer surface post the CMP polishing step. In other embodiments, the cleaning compositions of the present disclosure can be employed to remove abrasive residues/particles and/or polishing byproducts, and reduce scratches that cause defectivity on the wafer surface post the CMP polishing step.

Without wishing to be bound by theory, it is believed that the organic particles are generated from polishing composition components, which deposit on a substrate surface after polishing, and are insoluble and thus remain as contaminants on the wafer surface. The presence of these contaminants causes defect counts on the wafer surface. These defect counts, when analyzed on a Defect measuring tool (such as the AIT-XUV tool from KLA Company) provide the total defect counts (TDC) that is a sum of all the individual defect counts (see FIG. 2). In one or more embodiments, the cleaning compositions described herein remove from at least about 30% (e.g., at least about 50%, at least about 75%, at least about 80%, at least about 90%, at least about 95%, at least about 98%, at least about 99%, at least about 99.5%, or at least about 99.9%) to at most about 100% of the total defect counts (TDC) remaining on a substrate surface after the polishing/CMP process. The TDC removal from the wafer surface by the post-CMP cleaning composition is called Cleaning Efficacy of the cleaning composition and is expressed as a percentage. The higher the percentage, the better the cleaning efficacy and the more potent/powerful/effective is the cleaning composition.

Without wishing to be bound by theory, it is believed that there is a surprising and unexpected synergism with the components of the cleaning compositions described herein. For example, the organic acids can reduce scratches and solubilize metal oxide and silica containing residues (e.g., abrasive residues on a wafer) that can cause scratching, the amino acids can serve as corrosion inhibitors for metals (e.g., tungsten), and the anionic polymer is an excellent solubilizer for hydrophobic organic residues left on a substrate surface after a CMP process. Further, it is believed that the combination of a tricarboxylic organic acid (e.g., citric acid) and a dienoic acid (e.g., sorbic acid), optionally along with an amino acid (e.g., histidine or glycine) and an anionic polymer, shows significant reduction in metal galvanic corrosion, which is key to improving the yield of substrates cleaned after a CMP process.

In some embodiments, this disclosure features a method of cleaning a substrate (e.g., a wafer). The method can include contacting the substrate with the cleaning composition described herein. In post-CMP cleaning applications, the cleaning composition can be applied in any suitable manner to the substrate to be cleaned. For example, the cleaning composition can be used with a large variety of conventional cleaning tools and techniques (e.g., brush scrubbing, spin rinse dry, etc.). In one or more embodiments, after the CMP polishing step, the cleaning composition described herein can be employed in a Megasonic cleaner module or in Brush Box 1 or Brush Box 2 of Applied Materials Reflexion 300 mm CMP polishing tool. The Brush Box has brushes for scrubbing action whereas the cleaning composition provides the chemical action to remove defects. The cleaning composition can be applied on a wafer surface in the brush box or the megasonic for a time ranging from about 5 sec to about 10 minutes (e.g., from about 15 sec to 5 minutes) at a temperature in the range of 20° C. to 60° C.

In addition to the brush boxes and/or megasonic cleaner, the cleaning composition described herein can be used as an abrasive-free buffing chemistry for on-platen buffing of wafers on the Reflexion polisher to remove defectivity by buffing the wafer on a soft pad in presence of the cleaning composition on the polishing pad. In other embodiments, the cleaning composition can be used in the buffing station to buff on a soft poromeric pad in the buffing station modules of the 4-platen Applied Materials Reflexion Prime 300 mm CMP polishing tool.

In some embodiments, the substrate to be cleaned can include at least one material selected from the group consisting of low-k dielectrics (e.g., porous silicon oxide with k<3.5), ultralow-k dielectrics (e.g., ultra-porous silicon oxide with k<2.5), tungsten, titanium nitride, tantalum nitride, silicon carbide, silicon oxide (e.g., TEOS), silicon nitride, copper, cobalt, molybdenum, ruthenium, and polysilicon on a wafer surface that can be exposed to the cleaning composition during a cleaning process.

In some embodiments, the method that uses a cleaning composition described herein can further include producing a semiconductor device from the substrate treated by the cleaning composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the cleaning composition described herein.

Although only a few example embodiments have been described in detail below, those skilled in the art will readily appreciate that many modifications are possible in the ensuing example embodiments without materially departing from this invention. Accordingly, all such modifications are intended to be included within the scope of this disclosure as defined in the claims.

EXAMPLES

Examples are provided to further illustrate the capabilities of the post-CMP cleaning compositions and methods of the present disclosure. The provided examples are not intended and should not be construed to limit the scope of the present disclosure. Any percentages listed are by weight (wt %) unless otherwise specified. The anionic polymers described in the examples were obtained from a variety of suppliers and may, in some instances, include minor differences in carbon chain lengths and molecular weights. The examples shown herein are representative and cannot encompass the complete broad scope of this invention disclosure.

Figure 2:
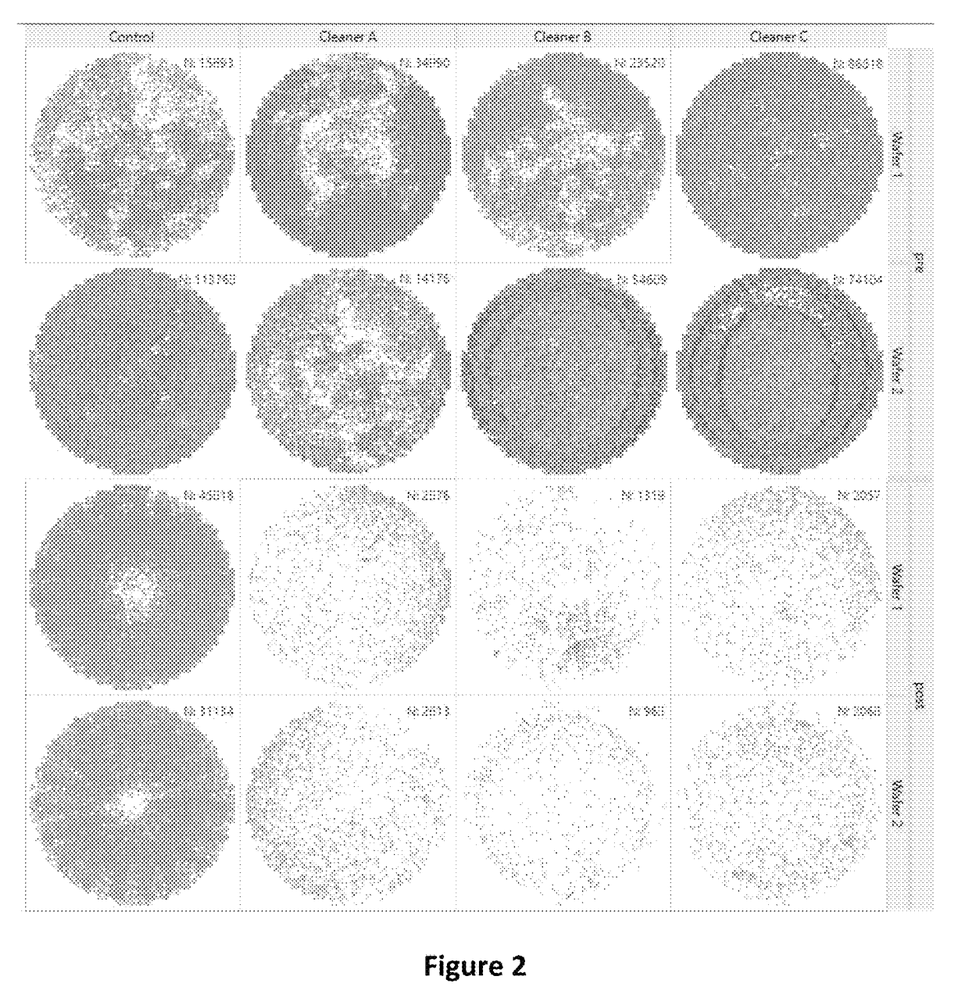

Example 1: Demonstration of Defectivity Reduction and Post-CMP Cleaning Efficacy of the Post-CMP Cleaning Compositions on Silicon Nitride Wafers In this example, the Control/Comparative post-CMP cleaning composition was Fujifilm Wako CLEAN-100 that is an industry workhorse and has been used as an industry standard post-CMP cleaning composition for more than 10 years for copper interconnect cleaning. Wako CLEAN-100 is commonly known to include citric acid, a non-polymeric surfactant, and water. Four representative examples of p-CMP Cleaners (i.e., Cleaners A, B, C, and D) from this disclosure are compared to CLEAN-100 as shown in FIG. 2 and in Table 1. Cleaner A contained one anionic polymer (i.e., poly(vinylphosphonic acid) and two organic acids (i.e., citric acid and glycine). Cleaner B contained two anionic polymers (i.e., poly(4-styrenylsulfonic) acid and poly(acrylic) acid) and three organic acids (i.e., citric acid, sorbic acid, and histidine). Cleaner C contained one anionic polymer (i.e., 2-acrylamido-2-methyl-1-propanesulfonic acid-acrylic acid copolymer) and three organic acids (i.e., citric acid, sorbic acid and histidine). Cleaner D contained one anionic polymer (i.e., poly(4-styrenesulfonic acid-co-acrylic acid-co-vinylphosphonic acid) terpolymer) and one organic acid (i.e., citric acid).

The Comparative Example CLEAN-100 was diluted 100× to obtain a Point of Use (POU) cleaning composition, whereas the examples of this disclosure, Cleaners A-D, were each diluted 200× to obtain POU post-CMP cleaning compositions.

For the post-CMP cleaning performance test, the incoming defectivity (TDC pre-cleaning) was measured on the SiN 12 inch wafers. Thereafter, the Applied Materials Reflexion polisher was used to polish the 12 inch SiN wafers. The brush box of the polisher (containing PVA brushes) was flooded with the P-CMP cleaning composition (CLEAN-100 or Cleaners A-D; on separate independent CMP polishing runs on different SiN blanket wafers). After CMP polishing, the SiN wafers were moved through the brush box containing the P-CMP cleaning composition. After cleaned by a combination of chemical and the mechanical actions, the SiN wafers come out dry (dry-in and dry-out tool) and post-cleaning defectivity (TDC post-cleaning) was measured on the AIT tool by KLA. The TDC pre-cleaning & TDC post-cleaning are summarized in Table 1 below and shown in FIG. 2. Specifically, FIG. 2 displays the total defect counts (TDC) wafer maps pre- and post-cleaning with CLEAN-100 and Cleaners A-C on silicon nitride (SiN) wafers. Table 1 summarizes and quantifies the results of CLEAN-100 and Cleaners A-D.

As can be seen in Table 1, the Comparative Example CLEAN-100 showed 40% cleaning efficacy on SiN blanket films. In other words, the TDC on the SiN wafer was reduced by 40% after using CLEAN-100 as the post-CMP cleaning composition. Typically, for a good post-CMP cleaning composition, the cleaning efficacy should be >60%. Surprisingly, the P-CMP cleaning compositions of this disclosure were particularly effective in cleaning up SiN wafer surfaces. As can be seen in Table 1, the cleaning efficacies of Cleaners A-D were 89%, 97%, 98%, and 92%, respectively. The cleaning efficacy was calculated by the following equation: cleaning efficacy=[(pre-cleaning TDC—post-cleaning TDC)/pre-cleaning TDC]×100%.

TABLE 1

SiN blank wafer defectivity and total defect counts (TDC) pre- and post-cleaning

| Sample | Anionic Polymer | Organic Acid | Amino Acid | Dienoic Acid | Average TDC pre-cleaning | Average TDC post-cleaning | Cleaning Efficacy |
|---|---|---|---|---|---|---|---|
| Control/ Comparative (CLEAN-100) | None, but included a non-polymeric surfactant | Citric Acid | None | None | 64728 | 38476 | 40% |

TABLE 1-continued

SiN blank wafer defectivity and total defect counts (TDC) pre- and post-cleaning

| Sample | Anionic Polymer | Organic Acid | Amino Acid | Dienoic Acid | Average TDC pre-cleaning | Average TDC post-cleaning | Cleaning Efficacy |
|---|---|---|---|---|---|---|---|
| Cleaner A | Poly(vinylphosphonic acid) | Citric Acid | Glycine | None | 24583 | 2594 | 89% |
| Cleaner B | Poly(4-styrenylsulfonic) acid & Poly(acrylic) acid | Citric Acid | Histidine | Sorbic acid | 39064 | 1141 | 97% |
| Cleaner C | 2-Acrylamido-2-methyl-1-propanesulfonic acid-acrylic acid copolymer | Citric Acid | Histidine | Sorbic acid | 80461 | 2062 | ~98% |
| Cleaner D | Poly(4-styrenesulfonic acid-co-acrylic acid-co-vinylphosphonic acid) terpolymer | Citric Acid | None | None | 31824 | 1868 | 92% |

Since Cleaner C was the most effective post-CMP cleaning composition, it was further studied in other examples on other films such as Cu & TaN couple (Example 2), W & TiN couple (Example 3), and non-metals such as silicon oxide (TEOS & HARP), silicon nitride and silicon carbide (Example 4). Cleaner C contained 2-acrylamido-2-methyl-1-propanesulfonic acid-acrylic acid copolymer (anionic polymer), citric acid (first organic acid), sorbic acid (second organic acid, a dienoic acid), and histidine (third organic acid, an amino acid). The anionic polymer was a copolymer of 2-acrylamido-2-methyl-1-propanesulfonic acid and acrylic acid, which is referred to herein as "2-acrylamido-2-methyl-1-propanesulfonic acid-acrylic acid copolymer" and has CAS #40623-75-4.

The performance of Cleaner C on patterned wafers (containing multiple metal & non-metal films) in a post-CMP cleaning process is described in Example 5. For Examples 2, 3, 4 & 5, Cleaner C was diluted 200× to obtain a POU post-CMP cleaning composition.

As Cu and W are the two most important metals in semiconductor processing, not only were wafer maps studied for defectivity but also electrochemical properties were studied for these metallic couples with Cleaner C. Cleaner C was also studied (see Example 4) on non-metal/silicon based dielectric films for TDC and post-CMP cleaning efficacy.

Example 2: Post-CMP Cleaning Performance and Electrochemical Properties on Cu & TaN Couple by Cleaner C In this example, the inventive composition Cleaner C was studied on blanket copper (Cu) and tantalum nitride (TaN) wafers for defectivity performance/reduction of TDC and for electrochemical/galvanic corrosion properties. Cu typically occurs in back end interconnect structure and is responsible for the wiring of the transistors. Cu occurs in the multi-level metallization with TaN barrier that prevents leakage of electrons migrating through the Cu wires. Thus, it is typical to see Cu metal encapsulated in TaN barrier metal nitride. As such, both Cu & TaN wafers were studied in this example.

The average TDCs on pre- and post-cleaning Cu and TaN blanket wafers were measured on the KLA AIT XUV tool and the results are summarized in Table 2. As shown in Table 2, Cleaner C surprisingly exhibited a high cleaning efficacy (i.e., 89%) with respect to the TaN blanket wafer.

TABLE 2

Cleaner C defectivity reduction performance on Cu & TaN blanket wafers

| Wafer Film | Average TDC pre-cleaning | Average TDC post-cleaning | Cleaning Efficacy |
|---|---|---|---|
| Cu | 864 | 762 | 12% |
| TaN | 1344 | 143 | 89% |

The electrochemical properties of Cleaner C, Cleaner C without a dienoic acid, and Comparative CLEAN-100 on Cu and TaN blanket wafer are summarized in Table 3. As can be seen in Table 3, Cleaner C exhibited very low Static Etch Rates (SER), i.e., 9.2 A/min on a Cu film and 0.2 A/min on a TaN film, compared to Cleaner C without a dienoic acid and CLEAN-100 (which did not include an anionic polymer or an amino acid or a dienoic acid). In addition, Cleaner C showed a smaller galvanic corrosion coupling current (Δ Ecorr.) of about 735 mV compared to Cleaner C without a dienoic acid and CLEAN-100. These results suggest that Cleaner C exhibited significantly reduced corrosion of Cu and TaN after post-CMP cleaning when compared to Cleaner C without a dienoic acid and CLEAN-100. In other words, the post-CMP Cleaner C exhibited favorable electrochemical properties compared to Cleaner C without a dienoic acid and CLEAN-100. Without wishing to be bound by theory, it is believed that the synergistic effect of the amino acid (histidine) and the dienoic acid (sorbic acid) in Cleaner C (which together synergistically acted as dual corrosion inhibitors for Cu and TaN surface protection or passivation) provided much lower SER and corrosion potential for Cleaner C when compared to Cleaner C without a dienoic acid and CLEAN-100.

TABLE 3

Static etch rates (SER) and electrochemical/corrosion properties of BEOL metals such as copper (Cu) and liners such as tantalum nitride (TaN) for an inventive formulation (Cleaner C) and Comparative formulation (CLEAN-100).

| P-CMP Formulation | PoU Dilution | Cu SER @60° C. (Å/min) | TaN SER @60° C. (Å/min) | Cu Ecorr. (mV) | Cu Icorr (uA) | TaN Ecorr. (mV) | TaN Icorr. (uA) | Δ Ecorr. (Cu-TaN) (mV) |
|---|---|---|---|---|---|---|---|---|
| Cleaner C | 200x | 9.2 | 0.20 | −65.57 | 0.256 | −801.35 | 0.0004 | 735.79 |
| Cleaner C without dienoic acid | 200x | 53.5 | 1.7 | −68.54 | 2.085 | −879.51 | 0.005 | 810.97 |
| Control/ Comparative CLEAN-100 | 100x | 27.2 | 1.32 | −70.53 | 0.023 | −852.75 | 0.0010 | 782.22 |

Icorr = Corrosion current; Ecorr = Corrosion voltage

Example 3: Post-CMP Cleaning Performance and Electrochemical Properties on W & TiN Couple by Cleaner C In this example, the inventive composition Cleaner C was studied on Tungsten (W) and Titanium Nitride (TiN) blanket wafers for defectivity performance/reduction of TDC and for electrochemical/galvanic corrosion properties. W typically occurs in front end metal gate area and in contacts, vias and plugs. After Cu, W is the most prevalent metal in semiconductors. W typically occurs in tandem with TiN barrier that prevents leakage of electrons migrating through the W metal gates, plugs, contacts or wires. Thus, it is typical to have the W metal encapsulated in TiN barrier metal nitride. Thus, both the W & TiN were studied in this example.

TABLE 4

Cleaner C defectivity reduction performance on W & TiN blanket wafers.

| Wafer Film | Average TDC pre-cleaning | Average TDC post-cleaning | Cleaning Efficacy |
|---|---|---|---|
| W | 365 | 24 | 93% |
| TiN | 22833 | 10875 | 52% |

Figure 3:
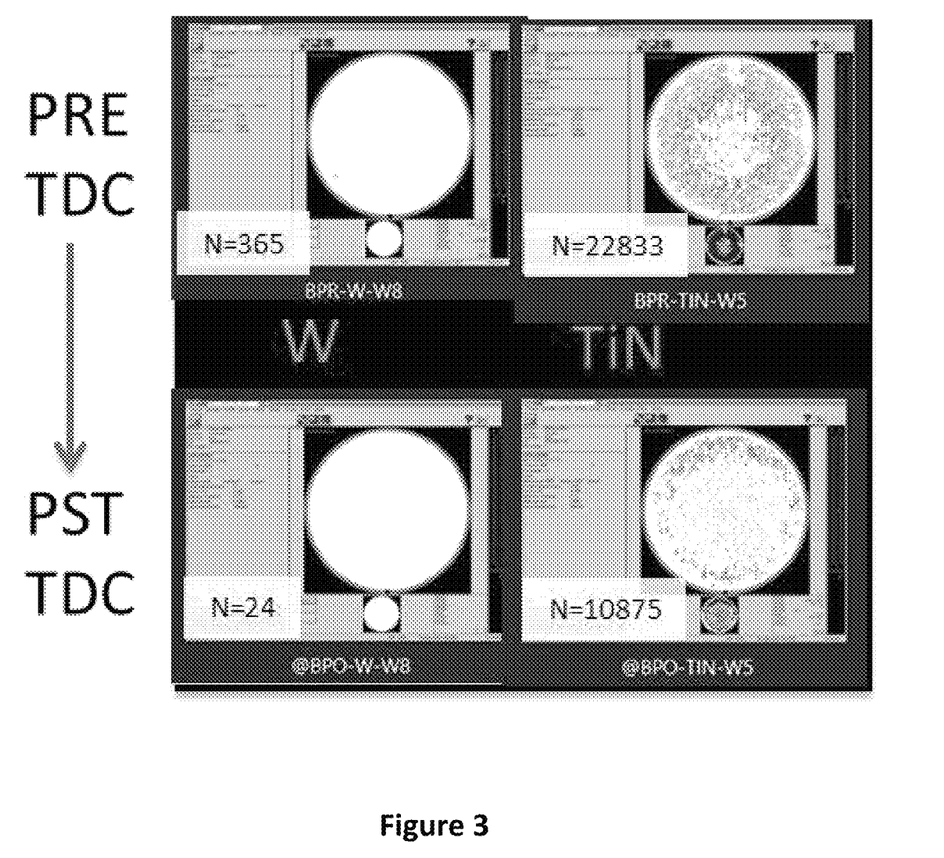
FIG. 3: Total defect counts (TDC) on Tungsten (W) and Titanium Nitride (TiN) wafers before post-CMP cleaning (PRE TDC) and after post-CMP cleaning (PST TDC) with Cleaner C collected on a KLA AIT XUV tool.
Figure 4:
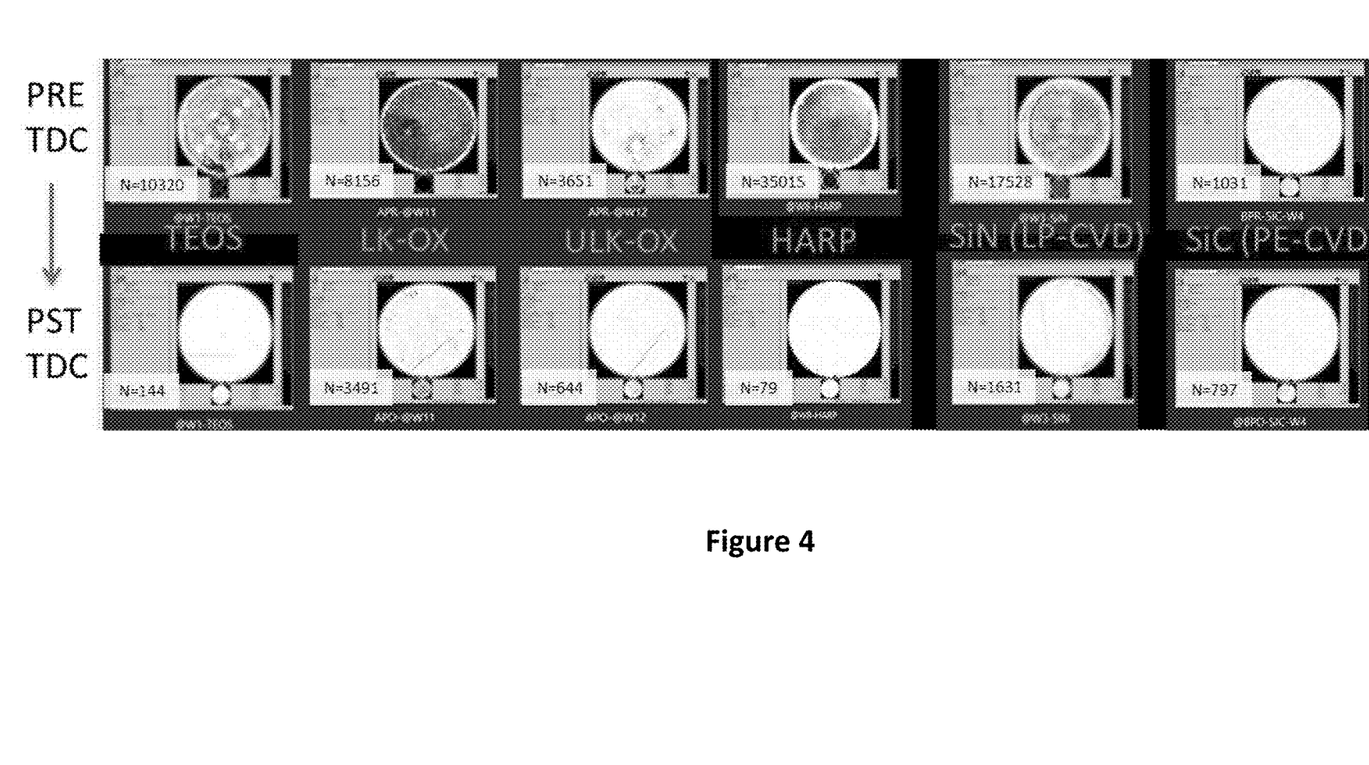
FIG. 4: Total defect counts (TDC) on various non-metals/silicon based dielectric films collected on a KLA AIT XUV tool. TDC are shown before post-CMP cleaning (PRE TDC) and after post-CMP cleaning (PST TDC) with Cleaner C. Films shown (from left to right) are i) TEOS (a form of silicon oxide), ii) LK (Low k dielectric), iii) ULK (Ultra low k dielectric), iv) HARP (another form of silicon oxide), v) SiN (silicon nitride), and vi) SiC (silicon carbide).

The average TDCs on pre- and post-cleaning W and TiN blanket wafers are summarized in Table 4 and shown in FIG. 3. As shown in Table 4, Cleaner C was surprisingly effective in cleaning the W wafers as its post-CMP cleaning efficacy was as high as 93% for W films.

The electrochemical properties of Cleaner C, Cleaner C without a dienoic acid (sorbic acid) and Comparative CLEAN-100 on W and TiN blanket wafers are summarized in Table 5. Also included in Table 5 are two compositions Cleaner E and F, which are identical to Cleaner C except that the histidine used in Cleaner C was replaced by an equivalent amount of glycine and aspartic acid, respectively. As can be seen in Table 5, Cleaner C exhibited relatively low Static Etch Rates (SER), i.e., 1.48 A/min on a W film and 0.068 A/min on a TiN film, amongst the tested cleaning compositions. In addition, Cleaner C showed the smallest galvanic corrosion coupling current voltage (Δ Ecorr.) of about 119 mV and lower SERs compared to CLEAN-100 (which did not include an anionic polymer or amino acid or dienoic acid) or Cleaner C without a dienoic acid, indicating that there is substantially less corrosion of W and TiN after post-CMP cleaning with Cleaner C when compared to CLEAN-100 or Cleaner C without a dienoic acid. Without being bound by theory, it is believed that the synergistic combination of first organic acid (a carboxylic acid), second organic acid (a dienoic acid), and third organic acid (an amino acid) as present in Cleaner C can significantly lower SER and improve metal corrosion inhibition. In conclusion, the post-CMP Cleaner C (which contained a dienoic acid) exhibited the most favorable electrochemical properties compared to CLEAN-100 as Cleaner C had lower galvanic corrosion and much lower SERs.

TABLE 5

Static etch rates (SER) and electrochemical/corrosion properties of FEOL metals such as Tungsten (W) and liners such as titanium nitride (TiN) for inventive formulations and Comparative formulation (CLEAN-100).

| P-CMP Formulation | PoU Dilution | WSER @60 °C (Å/min) | TiN SER @60 °C (Å/min) | W Ecorr. (mV) | W Icorr (uA) | TiN Ecorr. (mV) | TiN Icorr. (uA) | Δ Ecorr. (W-TiN) (mV) |
|---|---|---|---|---|---|---|---|---|
| Cleaner C | 200x | 1.48 | 0.068 | −295.64 | 0.007 | −415.21 | 0.027 | 119.57 |
| Cleaner C without Dienoic acid | 200x | 8.6 | 0.58 | −309.04 | 0.057 | −455.71 | 0.035 | 146.67 |
| Control/ Comparative CLEAN-100 | 100x | 5.52 | 0.199 | −235.07 | 0.114 | −467.98 | 0.018 | 232.90 |
| Cleaner E (w/ glycine) | 200x | 1.15 | 0.126 | −245.18 | 0.333 | −486.49 | 0.048 | 241.31 |
| Cleaner F (w/ aspartic acid) | 200x | 1.48 | 0.178 | −239.07 | 0.297 | −485.7 | 0.108 | 246.63 |

Example 4: Post-CMP Cleaning Performance on Non-Metals/Silicon Based Dielectrics by Cleaner C On a typical patterned wafer/device wafer, metals such as Cu and W are present along with non-metals/insulators such as silicon oxide, nitrides, and carbides. The metals/wires conduct electricity/electrons and the non-metals/insulators prevent electron leakage by encapsulating the metals. The most important metals are generally Cu and W, whereas the most important insulators/dielectrics are generally silicon oxide and silicon nitride. Thus, it would be desirable for a cleaning composition to have effective cleaning performance on these insulators/non-metals as they are comingled with the metals on any semiconductor chip.

In this example, the inventive composition Cleaner C was studied on various non-metals commonly found as silicon based dielectric films. Specifically, the silicon based dielectric films studied were i) TEOS (a form of silicon oxide), ii) LK (low k dielectric; e.g., porous silicon oxide with k<3.5), iii) ULK (ultra-low k dielectric; e.g., ultra-porous silicon oxide with k<2.5), iv) HARP (another form of silicon oxide), v) SiN (silicon nitride), and vi) SiC (silicon carbide). The average TDCs on pre- and post-cleaning dielectrics blanket wafers and the cleaning efficacy of Cleaner C on these six films are summarized in Table 6.

The main silicon based dielectrics of interest as an insulator to the Cu and W conductors for semiconductor devices are silicon oxide (TEOS & HARP) and silicon nitride (SiN). As can be seen in Table 6, Cleaner C surprisingly exhibited remarkable cleaning efficacy on both silicon oxides (99% for TEOS and 99.8% for HARP) and silicon nitride (91%).

TABLE 6

Cleaner C defectivity reduction performance on non-metals/silicon based blanket wafers.

| Wafer Film | Average TDC pre-cleaning | Average TDC post-cleaning | Cleaning Efficacy |
|---|---|---|---|
| TEOS | 10320 | 144 | 99% |
| LK | 8156 | 3491 | 57% |
| ULK | 3651 | 644 | 82% |
| HARP | 35015 | 79 | 99.8% |
| SiN | 17528 | 1631 | 91% |
| SiC | 1031 | 797 | 23% |

Example 5: Post-CMP Cleaning Performance on Patterned Device Wafers by Cleaner C Examples 1 through 4 have shown Cleaner C's performance on blanket films, which contained only one kind of material exposed to the post-CMP cleaning composition. However, actual chips/devices typically contain many metal and non-metal film types on a single chip. These multi-film wafers are called patterned wafers, which are cut into dies/individual chips once all the fabrication/processing has taken place on the patterned wafer.

Figure 5:
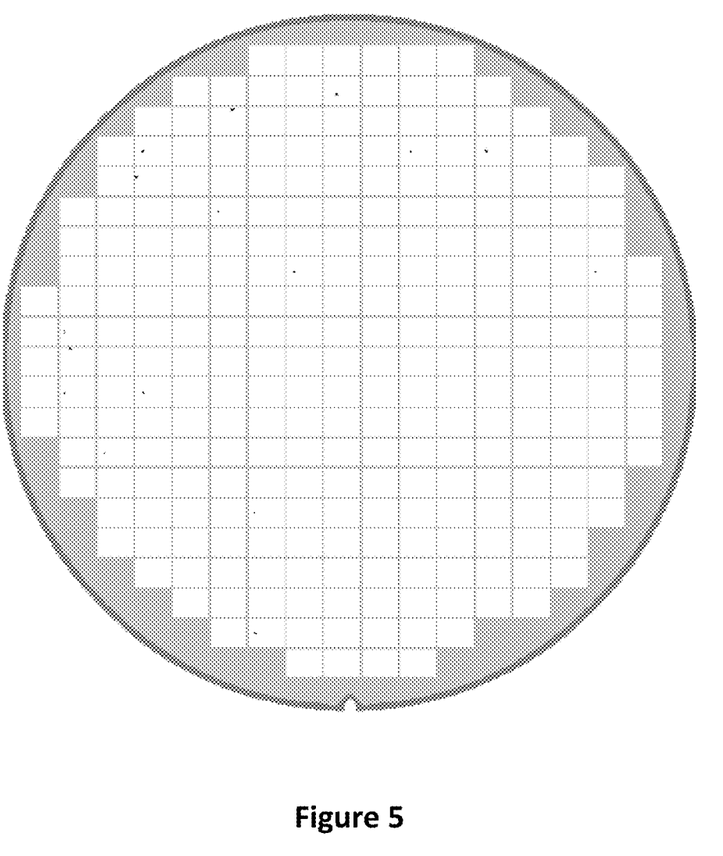
FIG. 5: Total defect counts (TDC) on a patterned wafer containing multiple metal and non-metal films collected on a KLA AIT XUV tool. The TDC is shown after post-CMP cleaning (PST TDC) with Cleaner C. The patterned wafer containing multiple chips had a PST-TDC of ~150 for defects having a size >180 nm.

In example 5, Cleaner C's performance was tested on a patterned wafer that had been polished by CMP processes. After cleaning with Cleaner C, the total defect counts (TDC) were analyzed on a KLA AIT-XUV defectivity measuring tool. The TDC map of the patterned wafer after being cleaned by Cleaner C at a 200× Point of Use (POU) dilution is shown in FIG. 5. As can be seen from FIG. 5, the patterned wafer was very clean and had very low defectivity. The TDC for the patterned wafer was as low as about 150 for defects having a size >180 nm. This further confirms the high defectivity cleaning efficacy of the cleaning compositions of the present disclosure on patterned/device wafers.

While this disclosure has been described with respect to the examples set forth herein, it is understood that other modifications and variations are possible without departing from the spirit and scope of the disclosure as defined in the appended claims.

What is claimed is:

1. A cleaning composition comprising:
   at least one first organic acid;
   at least one second organic acid different from the at least one first organic acid, the at least one second organic acid comprising a dienoic acid;
   at least one third organic acid different from the at least one first and second acids, the at least one third organic acid comprising an amino acid;
   at least one anionic polymer; and
   water;
   wherein the composition has a pH of from about 0.1 to about 7.

2. The composition of claim 1, wherein the at least one first organic acid comprises a monocarboxylic acid or a polycarboxylic acid.

3. The composition of claim 1, wherein the at least one first organic acid is selected from the group consisting of formic acid, acetic acid, malonic acid, citric acid, propionic acid, malic acid, adipic acid, succinic acid, aspartic acid, ascorbic acid, lactic acid, oxalic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, peracetic acid, potassium acetate, phenoxyacetic acid, benzoic acid, and mixtures thereof.

4. The cleaning composition of claim 1, wherein the at least one first organic acid is selected from the group consisting of acetic acid, malonic acid, citric acid, propionic acid, malic acid, succinic acid, ascorbic acid, lactic acid, oxalic acid, and mixtures thereof.

5. The composition of claim 1, wherein the at least one first organic acid is in an amount of from about 0.00001% to about 50% by weight of the composition.

6. The composition of claim 1, where the at least one second organic acid comprises a dienoic acid having from 5 to 22 carbons.

7. The composition of claim 6, wherein the at least one second organic acid comprises 2,4-pentadienoic acid, 5-phenylpenta-2,4-dienoic acid, 2-hydroxypenta-2,4-dienoic acid, 2,4-hexadienoic acid, 4,5-hexadienoic acid, 4,6-heptadienoic acid, 2,6-dimethylhepta-2,5-dienoic acid, (3E,5E)-hepta-3,5-dienoic acid, (2E,5Z)-Hepta-2,5-dienoic acid, octa-3,5-dienoic acid, (Z)-3,7-dimethyl-2,6-octadienoic acid, 5,7-nonadienoic acid, (E,Z)-2,4-decadienoic acid, 2,5- decadienoic acid, undecadienoic acid, dodecadienoic acid, tridecadienoic acid, tetradecadienoic acid, pentadecadienoic acid, hexadecadienoic acid, heptadecadienoic acid, (9Z,12E)-octadeca-9,12-dienoic acid, octadeca-10,12-dienoic acid, (10E,15Z)-9,12,13-trihydroxyoctadeca-10,15-dienoic acid, 13(S)-hydroxyoctadeca-9Z,11E-dienoic acid, nonadecadienoic acid, henicosadienoic acid, docosadienoic acid, eicosa-11,14-dienoic acid, or a mixture thereof.

8. The composition of claim 1, wherein the at least one second organic acid is in an amount of from about 0.0001% to about 0.5% by weight of the cleaning composition.

9. The composition of claim 1, wherein the at least one third organic acid comprises amino carboxylic acid, glycine, bicine, tricine, alanine, histidine, valine, phenylalanine, proline, glutamine, aspartic acid, glutamic acid, arginine, lysine, tyrosine, or a mixture thereof.

10. The composition of claim 1, wherein the at least one third organic acid comprises glycine, histidine, alanine, proline, arginine, lysine, aspartic acid, or a mixture thereof.

11. The composition of claim 1, wherein the at least one third organic acid is in an amount of from about 0.001% to about 20% by weight of the composition.

12. The composition of claim 1, wherein the at least one anionic polymer is formed from one or more monomers selected from the group consisting of (meth)acrylic acid, maleic acid, acrylic acid, acrylamide, malic acid, methacrylic acid, vinyl phosphonic acid, vinyl sulfonic acid, allyl sulfonic acid, styrene sulfonic acid, acrylamide, acrylamidopropyl sulfonic acid, phosphonic acid, phosphoric acid, vinyl phosphoric acid, butadiene/maleic acid, caprolactam, etherimide, 2-ethyl-2-oxazoline, N-iso-propylacrylamide, sodium phosphinite and co-formed products thereof, and sodium, potassium and ammonium salts thereof.

13. The composition of claim 1, wherein the at least one anionic polymer comprises poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), anionic poly(methyl methacrylate) (PMMA), anionic polyacrylamide (PAM), polyaspartic acid (PASA), anionic poly(ethylene succinate) (PES), anionic polybutylene succinate (PBS), poly(vinyl alcohol) (PVA), 2-propenoic acid copolymer with 2-methyl-2-((1-oxo-2-propenyl)amino)-1-propanesulfonic acid monosodium salt and sodium phosphinite, 2-propenoic acid copolymer with 2-methyl-2-((1-oxo-2-propenyl)amino)-1-propanesulfonic acid monosodium salt and sodium hydrogen sulfite sodium salt, 2-acrylamido-2-methyl-1-propanesulfonic acid-acrylic acid copolymer, poly(4-styrenesulfonic acid-co-acrylic acid-co-vinylphosphonic acid) terpolymer, or a mixture thereof.

14. The composition of claim 1, wherein the at least one anionic polymer comprises poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), anionic poly(methyl methacrylate) (PMMA), anionic polyacrylamide (PAM), 2-acrylamido-2-methyl-1-propanesulfonic acid-acrylic acid copolymer, poly(4-styrenesulfonic acid-co-acrylic acid-co-vinylphosphonic acid) terpolymer, or a mixture thereof.

15. The composition of claim 1, wherein the at least one anionic polymer is in an amount of from about 0.00001% to about 50% by weight of the cleaning composition.

16. The composition of claim 1, wherein the pH of the composition is from about 1 to about 6.5.

17. The composition of claim 1, wherein the pH of the composition is from about 2 to about 5.

18. A cleaning composition comprising:
at least one first organic acid;
at least one second organic acid different from the at least one first organic acid, the at least one second organic acid comprising a dienoic acid;
at least one third organic acid different from the at least one first and second acids, the at least one third organic acid comprising an amino acid;
at least one anionic polymer comprising poly(4-styrenylsulfonic) acid (PSSA), polyacrylic acid (PAA), poly(vinylphosphonic acid) (PVPA), poly(2-acrylamido-2-methyl-1-propanesulfonic acid), poly(N-vinylacetamide) (PNVA), 2-acrylamido-2-methyl-1-propanesulfonic acid-acrylic acid copolymer, poly(4-styrenesulfonic acid-co-acrylic acid-co-vinylphosphonic acid) terpolymer, or a mixture thereof; and
water;
wherein the composition has a pH of from about 0.1 to about 7.

19. The composition of claim 18, wherein the at least one anionic polymer comprising poly(vinylphosphonic acid) (PVPA), poly(2-acrylamido-2-methyl-1-propanesulfonic acid), poly(N-vinylacetamide) (PNVA), 2-acrylamido-2-methyl-1-propanesulfonic acid-acrylic acid copolymer, or poly(4-styrenesulfonic acid-co-acrylic acid-co-vinylphosphonic acid) terpolymer, or a mixture thereof.

20. A method for cleaning a wafer surface, comprising contacting a wafer having a surface comprising SiN, SiC, TiN, W, Ru, Mo, TEOS, Cu, TaN, Co, or p-Si with the cleaning composition of claim 1.

21. A method for cleaning a substrate, comprising:
contacting a substrate with the cleaning composition of claim 1.

* * * * *